United States Patent [19]
Bosch et al.

[11] Patent Number: 5,392,294
[45] Date of Patent: Feb. 21, 1995

[54] DIAGNOSTIC TOOL AND METHOD FOR LOCATING THE ORIGIN OF PARASITIC BIT FAULTS IN A MEMORY ARRAY

[75] Inventors: Louis J. Bosch, Hopewell Junction; Royle K. Smith, LaGrangeville, both of N.Y.

[73] Assignee: International Business Machines Corporation, Armonk, N.Y.

[21] Appl. No.: 666,824

[22] Filed: Mar. 8, 1991

[51] Int. Cl.$^6$ ............................................. G11C 29/00
[52] U.S. Cl. .................................. 371/21.2; 371/21.1
[58] Field of Search ................... 371/21.2, 21.3, 37.2, 371/38, 27, 21.1, 25.1, 24, 40.1; 365/201

[56] References Cited

U.S. PATENT DOCUMENTS

| | | | |
|---|---|---|---|
| 3,714,403 | 1/1973 | Ammann et al. | 371/21.2 |
| 4,005,405 | 1/1977 | West | 340/146.1 |
| 4,277,844 | 7/1981 | Hancock et al. | 371/38 |
| 4,388,684 | 6/1983 | Nibby, Jr. et al. | 371/40.1 |
| 4,417,339 | 11/1983 | Cantarella | 371/37 |
| 4,559,626 | 12/1985 | Brown | 371/21.2 |
| 4,562,576 | 12/1985 | Ratcliffe | 371/21 |
| 4,646,312 | 2/1987 | Goldsbury et al. | 371/38 |
| 4,648,091 | 3/1987 | Gajjar | 371/37 |
| 4,667,330 | 5/1987 | Kumagai | 371/21.2 |
| 4,723,245 | 2/1988 | Leslie | 371/37 |
| 4,739,504 | 4/1988 | Leslie | 371/37 |
| 4,739,505 | 4/1988 | Leslie | 371/37 |
| 4,739,506 | 4/1988 | Leslie | 371/37 |
| 4,744,086 | 5/1988 | Komly et al. | 371/40 |
| 4,989,210 | 1/1991 | Scheuneman et al. | 371/40.1 |
| 5,062,109 | 10/1991 | Ohshima et al. | 371/21.2 |
| 5,170,398 | 12/1992 | Fujieda et al. | 371/24 |

FOREIGN PATENT DOCUMENTS

| | | | |
|---|---|---|---|
| 0218830 | 4/1987 | European Pat. Off. | 371/21.2 |
| 56-119998 | 9/1981 | Japan . | |
| 0006498 | 1/1987 | Japan | 371/21.2 |
| 49112 | 2/1991 | Japan | 371/21.2 |

OTHER PUBLICATIONS

"Embedded Array Self-Test Simulator" IBM Technical Disclosure Bulletin, vol. 31, No. 8 Jan. 1989 pp. 171–174.

IBM Technical Disclosure Bulletin, vol. 23, No. 1, p. 203, Jun. 1980, H. J. Hollands et al., "Memory Tester Using Random Addresses And Random Data".

*Primary Examiner*—Robert W. Beausoliel, Jr.
*Assistant Examiner*—Phung My Chung
*Attorney, Agent, or Firm*—Charles W. Peterson, Jr.

[57] ABSTRACT

A technique is disclosed for distinguishing parasitic cell failures from other type failures of cells in a memory array. A parasitic failure is defined as one action between cells "k" and "j" such that writing into cell "j" causes a change in cell "k" without intentionally writing into cell "k."

A binary pattern generator, produces array test patterns equivalent to a Hamming single error correction code. Each of the patterns is associated with a syndrome bit position and is used to test each array address in turn. Each pattern is read back out by array address and the results are stored in a separate memory for storing the failing syndromes for each failing cell array address. For each cell failure, the syndrome bits form an "address" which is exclusive ORed with the address of the failed cell to yield the address of the root cell causing coupling (parasitic) failure of the failed cell.

10 Claims, 2 Drawing Sheets

DIAGNOSTIC TOOL AND METHOD FOR LOCATING THE ORIGIN OF PARASITIC BIT FAULTS IN A MEMORY ARRAY

BACKGROUND OF THE INVENTION

The present invention generally relates to faulty bit testing in memory arrays and, more particularly, to such testing directed to faults of a parasitic type, i.e., where undesirable coupling exists between cells "k" and "j" of a memory array such that writing into cell "j" causes a change in cell "k" without intentionally writing into cell "k."

Hamming codes have long been used in the art of memory fault testing and/or data correction. One common type of memory error detecting and data correcting scheme is described, for example, in U.S. Pat. No. 4,005,405, issued on Jan. 25, 1977 to Joseph Thomas West. Provision also is made for storing the physical location (address) of any defective memory word so that a correction word can be rewritten therein. The cited 4,005,405 patent, as well as all others of a similar nature known to the present inventors share one common characteristic, namely, no distinction is made between bit fault types, for example, bit faults of the parasitic type as opposed to the other types, much less is any attempt made to determine the location of the cell (which may be functioning correctly when tested by itself) which causes parasitic failure of some other array cell due to unknown and unwanted coupling.

The known prior art has not focused on parasitic-type faults apparently for the reason that it simply has been content to replace a faulty cell or data bit with an error-free cell or data bit irrespective of the reason behind the fault.

SUMMARY OF THE INVENTION

One object of the present invention is to provide a method and means for distinguishing parasitic from other type failures in memory cells of the same array.

Another object is to provide a method and means for locating the root cell causing the parasitic failures of other cells in the same memory array.

A further object is to provide a method and means for determining the address of the root cell of a memory array as well as the address of each parasitic cell which fails due to unwanted coupling from the root cell.

These and other objects, as will appear from a reading of the present specification, are achieved in a preferred memory cell array chip embodiment of the present invention by the provision of means including a binary pattern generator, the pattern being equivalent to a Hamming single error correction code for the size of the array, a failing syndrome memory, a failing address memory and an exclusive OR circuit. Each of the patterns is the coverage for a particular syndrome bit position. For example, a one megabit ($2^{20}$) memory array would require 20+1 patterns, each of which is associated with a syndrome bit position.

The succession of specific patterns comprising the described Hamming code is written into the array. Each of these patterns is read back out and the results are analyzed to generate, for each cell failure address, information bits representing which syndrome positions (which patterns) failed. These syndrome bits and array address for each failed cell are stored. For each cell failure, the syndrome failure (information) bits form an "address" which is exclusively ORed with the address of the failed cell. The result is the address of the root cell causing coupling (parasitic) failure of the failed cell.

If all of the syndrome failure bits are a "one," the observed cell failure is a "stuck" fault, i.e., the failed cell is locked into one permanent state which cannot be reversed. If all syndrome failure bits are not all "one," the failed cell has suffered a parasitic-type failure.

It has been observed that the same cell can be the root cause of parasitic failure in two or more other cells of an array. Thus, the discovery of the single root cell giving rise to a plurality of parasitic failures makes possible the more efficient replacement of the single root cell rather than the wasteful replacement of all of the related failed parasitic cells, in accordance with conventional redundancy techniques. It also facilitates a better understanding of the failure mechanism so that the unwanted coupling involved in the parasitic failure may be avoided in later corrected memory chip designs.

BEST MODE FOR CARRYING OUT THE INVENTION

Figure 1:
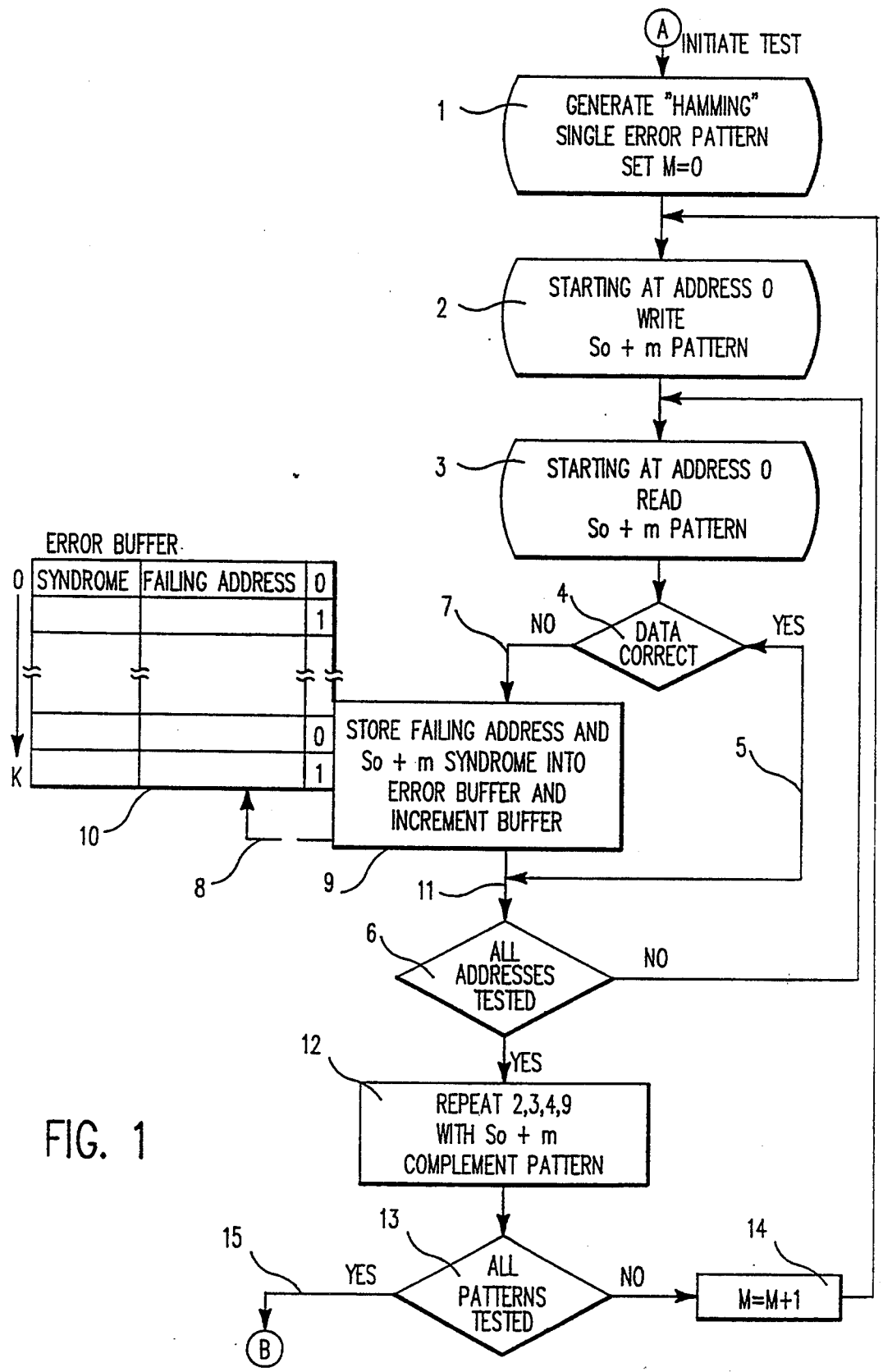
FIGS. 1 and 2 together comprise a simplified flow diagram representing the functioning of apparatus for carrying out the parasitic fault origin locating technique of the present invention.

Referring to the FIG. 1, the parasitic bit fault test is initiated at A by the generation (1) of Hamming single error syndromes or patterns and the setting of the incremented parameter m to the value 0. In general, if the size of the memory array to be tested is $2^n$, the number of patterns to be generated at (1) is n+1 (So→Sn, inclusive).

Then, starting at address 0 in the array, write (2) the pattern So+m (since initially m=0, So+m=So). Upon completion of writing, the pattern So is read back (3) and a comparison is made (4) between the pattern data written in and read back. If the compared data is correct (5), a decision is made (6) whether all addresses have been tested and if not, the next address is accessed and the reading (3) and comparison (4) is repeated to completion using pattern So+m.

If, as a result of the comparison (4) an error is noted (7), the failing address (8) is stored (9) in the error buffer 10 along with the So+m syndrome and the buffer is incremented. When all of the addresses have been noted as tested (11), functions 2, 3, 4 and 9 are repeated (12) using the So+m complement pattern. The specific nature of a failing cell syndrome and a complement pattern will be seen more clearly later with the aid of an example based upon a simplified 16-bit memory. Following the completion (13) of the use of the So+m complement pattern (SOC) through all array addresses, m is incremented (14) and functions 2, 3, 4 and 9 are repeated for pattern S1, and, subsequently for pattern S1C. Finally, all incremented pattern testing is completed (15) with all desired patterns. Referring now to the continuation of FIG. 1 at the top of FIG. 2, the entire process of FIG. 1 is repeated (16) but this time with the addresses being decremented from the most significant to the least significant rather than vice-versa as was first described. The decremented phase of the testing is necessary to ascertain whether there is any reverse address sequence coupling between the bit positions, i.e., whether a change in cell "k" will cause a change in cell "j." The incremented phase of the testing ascertains only whether a change in cell "j" will cause a change in cell "k." When all of the patterns have been tested for all of the incremented and the decremented addresses, the noted errors, if any, are noted (17) and error buffer 10 of FIG. 1 is sorted and the syndromes are stored by failing address in error buffer 18. All syndromes with the same failing address are logically ORed (19) and if all syndromes for the same address are a "1," a decision is made (20) that a "stuck fault" resides at that address and an appropriate notation is made (21) in the error map (22) for that address.

If at least one but not all syndromes for the same address are a "1," a decision is made (20) that the failure is a "coupled (parasitic) fault" failure and the syndromes are exclusive ORed (23) with the corresponding failing address (24). The result is checked (25) to determine whether the highest order bit is a "1," and if so the result is complemented (26) to yield the address (27) of the root cell that caused the coupled fault failure. The address of the root cell is directly available (28) if the highest order bit is not a "1" and so it is passed (without the need to complement) through gate 29 for application (via 30) to error map 22. Finally, error buffer 18 is examined (31) to determine whether all failing addresses have been processed for error map 22 and if so, the parasitic bit failure testing procedure is concluded. If not, a signal is generated (31) to cause (32) the testing process to step to the next failing address.

Figure 2:
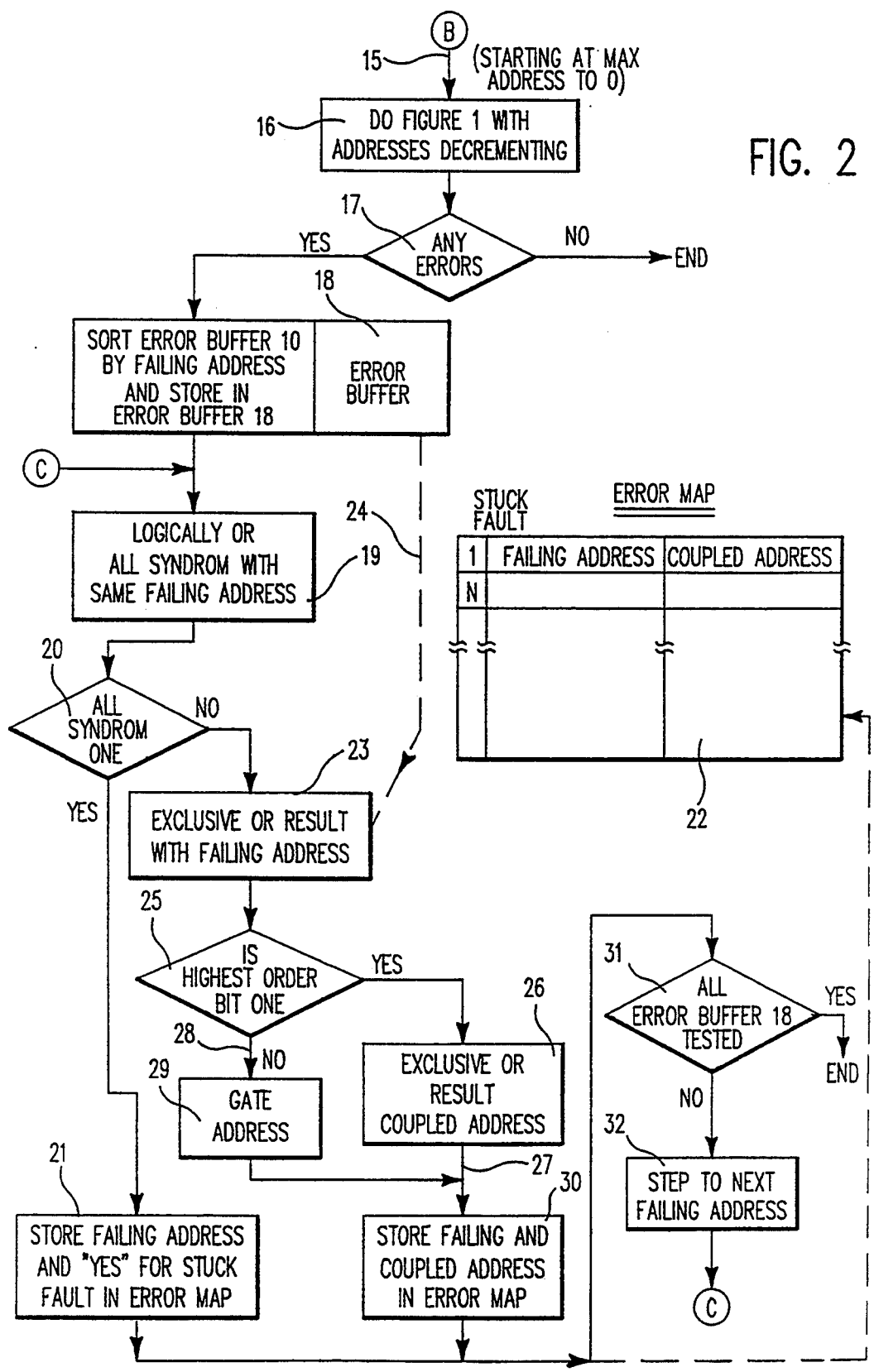

The procedures represented in FIGS. 1 and 2 can be better understood by reference to the following tabulated examples of coupling (parasitic) faults. For the sake of simplicity and clarity of exposition, a sixteen bit memory has been selected. In each case, the cell at address 9 is the "root" cell causing a coupling fault in the cell at address 2. It can be seen that irrespective of whether the fault arises on cell 9 switching to a "0" or to a "1," its address is uncovered by exclusive ORing the failing syndromes with the failing address, in accordance with the present invention.

|  | SYNDROME OR PATTERN | BINARY WEIGHT |
|---|---|---|
| 0000000000000000 | — S4 | = 16 |
| 1111111111111111 | — S4C | = 16 |
| 0000000011111111 | — S3 | = 8 |
| 1111111100000000 | — S3C | = 8 |
| 0000111100001111 | — S2 | = 4 |
| 1111000011110000 | — S2C | = 4 |
| 0011001100110011 | — S1 | = 2 |
| 1100110011001100 | — S1C | = 2 |
| 0101010101010101 | — S0 | = 1 |
| 1010101010101010 | — S0C | = 1 |

EXAMPLE

1. Cell at address 2 assumes a "1" when the cell at address 9 is written to a "1."

| Failing Syndromes S3 + S1C + S0 | = 01011 |
|---|---|
| Failing Address | = 00010 |
| Exclusive ORed | = 01001 Coupling Cell |

2. Cell at address 2 assumes a "0" when the cell at address 9 is written to a "0."

| Failing Syndromes S3C + S1 + S0C | = 01011 |
|---|---|
| Failing Address | = 00010 |
| Exclusive ORed | = 01001 Coupling Cell |

3. Cell at address 2 assumes a "0" when the cell at address 9 is written to a "1."

| Failing Syndromes S4C + SC2 | = 10100 |
|---|---|
| Failing Address | = 00010 |
| Exclusive ORed | = 10110 |
| Complement | = 01001 Coupling Cell |

4. Cell at address 2 assumes a "1" when the cell at address 9 is written to a "0."

| Failing Syndromes S4 + S2 | = 10100 |
|---|---|
| Failing Address | = 00010 |
| Exclusive ORed | = 10110 |
| Complement | = 01001 Coupling Cell |

Although the foregoing discussion has focused on a single coupling fault, multiple coupling faults (where a root cell causes coupling failures in two or more other array cells) also will be uncovered by the disclosed technique.

It will be noted by those skilled in the art that the functions represented in FIG. 1 and 2 are readily performed by the state-of-the-art programming of a general purpose computer. In such case designated blocks of circuitry will comprise means for sequentially applying test patterns equivalent to Hamming error correction codes to addresses of a memory array, means for reading out each pattern by array address and comparing the applied pattern to generate syndrome bits, means for storing the syndrome bits and the array address for each failed cell, and means for logically ORing the syndrome bits for each failed cell. In a preferred embodiment, such circuitry will also include means for determining whether the ORed syndrome bits are all "1" for the same array cell address and means for exclusive ORing all such syndrome bits for the same array cell address with the address bits thereof.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

What is claimed is:

1. A method for characterizing cell failures in an array of 2n memory cells comprising the steps of:

writing each one of n+1 test patterns to each address of said array, said n+1 test patterns being a Hamming error correction code pattern, whereby each said test pattern is written to each said array address in turn;

reading the contents of each said array address and comparing said read contents with the written one of said n+1 test patterns;

generating from each said comparison a plurality of syndrome bits, said syndrome bits identifying cell failures;

storing said plurality of syndrome bits and said array address for each said identified cell failure;

for each said failed cell array address, ORing said stored syndrome bits.

2. The method defined in claim 1 further comprising the step of:

determining whether or not the ORed syndrome bits are all "1" for each said failed array cell's address.

3. The method defined in claim 2 wherein when at least one of said ORed syndrome bits is determined to be a "0" further comprising the step of:

exclusive ORing all said stored syndrome bits for each identified said failed cell array address with the address thereof to provide an address related to the address of a root cell, said root cell causing the failure of said identified failed cell.

4. The method defined in claim 3 and further comprising the steps of:

determining whether the highest order bit of said related address is a "1"; and, if so, complementing said related address to provide the address of said root cell.

5. The method defined in claim 1 further comprising the step of:

applying each of said test patterns to each array address in turn, first incrementing said array address starting with the least significant address until completion and then, decrementing said array address starting with the most significant address until completion.

6. An apparatus for characterizing cell failures in an array of $2^n$ memory cells comprising:

means for writing $n+1$ test patterns to each address of said array in turn, said $n+1$ test patterns being a Hamming code pattern;

means for identifying cell failures;

means for storing a plurality of syndrome bits for each of said identified failed cells; and, means for ORing each of said failed cell's stored syndrome bits.

7. The apparatus defined in claim 6 further comprising:

means for determining whether or not the ORed syndrome bits are all "1" for each said failed cell array address.

8. The apparatus defined in claim 7 further comprising:

means for exclusive ORing all said stored syndrome bits for each said failed cell array address with the address thereof and providing an address related to a root cell, said root cell causing the failure of said failed cell.

9. The apparatus defined in claim 8 and further comprising:

means for determining whether the highest order bit of said related address is a "1"; and means for complementing said related address responsive to said determining means.

10. The apparatus defined in claim 6 further comprising:

means for incrementing or decrementing said array address.

* * * * *